United States Patent
Wang

(10) Patent No.: US 7,495,593 B2
(45) Date of Patent: Feb. 24, 2009

(54) SIGMA-DELTA MODULATOR CAPABLE OF COMPENSATING A TIME DELAY

(75) Inventor: Wen-Chi Wang, Hsi Luo Town (TW)

(73) Assignee: Realtek Semiconductor Corp., Hsinchu (TW)

( * ) Notice: Subject to any disclaimer, the term of this patent is extended or adjusted under 35 U.S.C. 154(b) by 0 days.

(21) Appl. No.: 11/715,871

(22) Filed: Mar. 9, 2007

(65) Prior Publication Data

US 2007/0210948 A1 Sep. 13, 2007

(30) Foreign Application Priority Data

Mar. 13, 2006 (TW) .............................. 95108480 A

(51) Int. Cl.
*H03M 3/00* (2006.01)
(52) U.S. Cl. ...................... 341/143; 341/155
(58) Field of Classification Search .......... 341/143–170
See application file for complete search history.

(56) References Cited

U.S. PATENT DOCUMENTS

| | | | |
|---|---|---|---|
| 5,084,702 A * | 1/1992 | Ribner | 341/143 |
| 5,103,229 A * | 4/1992 | Ribner | 341/143 |
| 6,234,658 B1 * | 5/2001 | Houldsworth | 341/77 |
| 6,275,177 B1 | 8/2001 | Ho et al. | |
| 6,750,795 B2 * | 6/2004 | Gupta | 341/143 |
| 6,750,796 B1 | 6/2004 | Holloway et al. | |
| 6,795,002 B2 * | 9/2004 | Gupta | 341/143 |
| 6,809,672 B2 * | 10/2004 | Gupta | 341/143 |
| 6,970,118 B2 * | 11/2005 | Regier | 341/144 |

OTHER PUBLICATIONS

IEEE ISSCC, Session 9, Switched-Capacitor ΔΣ Modulators, (2005), Paper 9.6 pp. 176-177, 591, 132-133, 567-568, Paper 9.7 pp. 178-179, 592, 134-135, 569, Paper 10.1 pp. 570.
Cherry et al., "Continuous-Time Delta-Sigma Modulators for High-Speed A/D Conversion: Theory, Practice and Fundamental Performance Limits," Kluwer Academic Publishers, pp. 74-103.

* cited by examiner

*Primary Examiner*—Lam T Mai
(74) *Attorney, Agent, or Firm*—Muncy, Geissler, Olds & Lowe, PLLC

(57) ABSTRACT

A sigma-delta modulator is disclosed. The sigma-delta modulator includes a first integrator, a second integrator, an analog-to-digital converter, a digital-to-analog converter (DAC), and a compensating device. The first integrator receives an input signal for generating a first output signal. The second integrator receives the first output signal for generating a second output signal. The ADC converts the second output signal into a digital modulation signal. The DAC converts the digital modulation signal into an analog feedback signal. The analog feedback signal is transmitted to the first integrator and the second integrator. The compensating device is for compensating the analog feedback signal for a time delay caused by a feedback loop from the ADC through the DAC to the first integrator.

4 Claims, 5 Drawing Sheets

SIGMA-DELTA MODULATOR CAPABLE OF COMPENSATING A TIME DELAY

BACKGROUND OF THE INVENTION

1. Field of the Invention

The present invention relates to a sigma-delta modulator, and more particularly, to a sigma-delta modulator comprising a continuous-time integrator.

2. Description of the Related Art

In general, a sigma-delta modulator has many advantageous features. For example, the sigma-delta modulator often has a high resolution and a high signal-to-noise ratio (SNR). The sigma-delta modulator is also a simple circuit, which doesn't need additional trimming circuits to perform its function. It is not sensitive to clock jitter, and has a good endurance against the variances of the circuit components. Please refer to FIG. 1, which is a diagram of a sigma-delta modulator 100 according to the prior art. As shown in FIG. 1, the sigma-delta modulator 100 is a discrete-time 2-stage (or more stages as indicated by the series of dots between the first discrete-time integrator 102 and the nth discrete-time integrator 104) sigma-delta modulator. The digital signal Y(z) outputted from the analog-to-digital converter (ADC) 106 is transmitted to the input end of each 1-stage discrete-time integrator 102, 104 as a feedback through the digital-to-analog converter (DAC) 108. It can be easily seen that the above-mentioned structure utilizes a feedback mechanism. Therefore, for an m-stage sigma-delta modulator, as the value of the number m increases, the resolution and the SNR of the sigma-delta modulator will be better. Furthermore, different resolutions and the SNRs can be derived through adjusting the coefficient of the inner integrator.

However, it is well-known that the above-mentioned discrete-time sigma-delta modulator 100 has some disadvantages. For example, it may encounter a signal aliasing phenomenon. The signal aliasing phenomenon arises when the discrete-time sigma-delta modulator 100 receives signals having different tones. When some of the sampling rates of the received signals are multiples of sampling rates of other received signals, the curves corresponding to all the received signals on the spectral plot overlap. The signal aliasing phenomenon makes it difficult to distinguish the signals having different tones.

In order to overcome the signal aliasing phenomenon, an anti-aliasing circuit should be established in the signal-receiving end of the sigma-delta modulator. However, setting the anti-aliasing circuit makes the entire discrete-time sigma-delta modulator 100 more complex.

Another solution is to utilize a continuous-time integrator as a first-stage integrator of the sigma-delta modulator 100. In this way, the anti-aliasing circuit can be simplified. However, a time delay of the signal is introduced due to the continuous-time integrator and the SNR of the sigma-delta modulator 100 is reduced.

Therefore, it is apparent that new and improved methods and devices are needed.

SUMMARY OF THE INVENTION

In view of the above-mentioned problems, an object of the invention is to provide a sigma-delta modulator which can simultaneously provide the advantages of both the discrete-time structure and the continuous-time structure to solve the above-mentioned time delay problem.

According to an embodiment of the claimed invention, a sigma-delta modulator is disclosed. The sigma-delta modulator includes a first integrator, for receiving an input signal an for generating a first output signal; a second integrator, for receiving the first outputting signal and generating a second output signal; an analog-to-digital converter (ADC), for converting the second output signal into a digital modulation signal; a digital-to-analog converter (DAC), for converting the digital modulation signal into an analog feedback signal and transmitting the analog feedback signal to the first integrator and to the second integrator; and a compensation device, for generating a compensation signal.

DETAILED DESCRIPTION OF THE INVENTION

Figure 2:
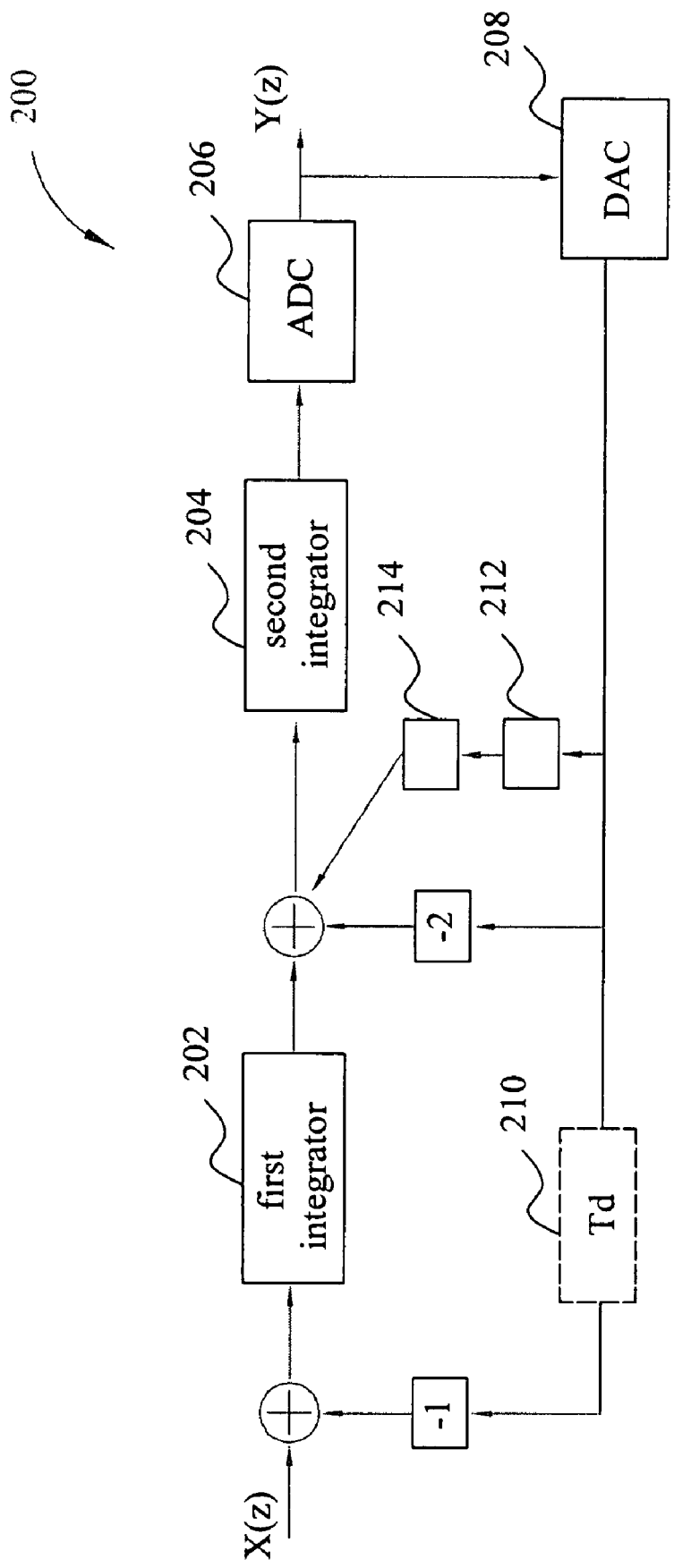
FIG. 2 is a block diagram of a sigma-delta modulator according to an embodiment of the present invention.

Please refer to FIG. 2. FIG. 2 is a block diagram of a sigma-delta modulator 200 according to an embodiment of to the present invention. As shown in FIG. 2, the sigma-delta modulator 200 includes a first integrator 202, a second integrator 204, an ADC 206, a DAC 208, a first compensation unit 212, and a second compensation unit 214.

In this embodiment of the present invention, the first integrator 202 is a continuous-time integrator, and the second integrator 204 is a discrete-time integrator. In this way, the first integrator 202 can operate as the anti-aliasing circuit. Furthermore, in this embodiment, the first compensation device 212 and the second compensation device 214 are utilized to compensate for the time delay 210. The time delay 210 is generated as a result of the signal transmitted from the ADC 206 through the DAC 208 to the first integrator 202. In this way, the continuous-time integrator 202 is not influenced because the time delay is effectively removed. Therefore, the first integrator 202 (e.g., a continuous-time integrator in this embodiment) can function equivalently as the above-mentioned discrete-time integrator. Furthermore, the DAC 208 can includes an element selection circuit (not shown).

The detailed operation and theory of the present invention is illustrated as follows. As shown in FIG. 2, the first integrator 202 receives an external input signal X(z) and generates a first output signal. The first output signal is then inputted into the second integrator 204, which is coupled to the first integrator 202. The second integrator 204 generates a second output signal.

After being generated by the second integrator 204, the second output signal is inputted into the ADC 206, which is coupled to the second integrator 204. The ADC 206 converts the second output signal into a digital modulation signal Y(z). The digital modulation signal Y(z) is then inputted into the DAC 208 where after the digital modulation signal Y(z) is converted into an analog feedback signal by the DAC 208. The analog feedback signal, is then transmitted back to the first integrator 202 and the second integrator 204 as a feedback signal. Please note that because the first integrator 202 is a continuous-time integrator, the first integrator 202 is still influenced by the time delay 210 of the signal due to the feedback, and this reduces the SNR of the sigma-delta modulator 200.

In the following disclosure, embodiments of the present invention will be illustrated by using a linear model and equations represented in a frequency domain and a Z domain. Furthermore, the noise transfer function (NTF) of the impulse response will be obtained. Please note that the impulse response includes a signal transfer function (STF) and a noise transfer function (NTF).

Figure 1:
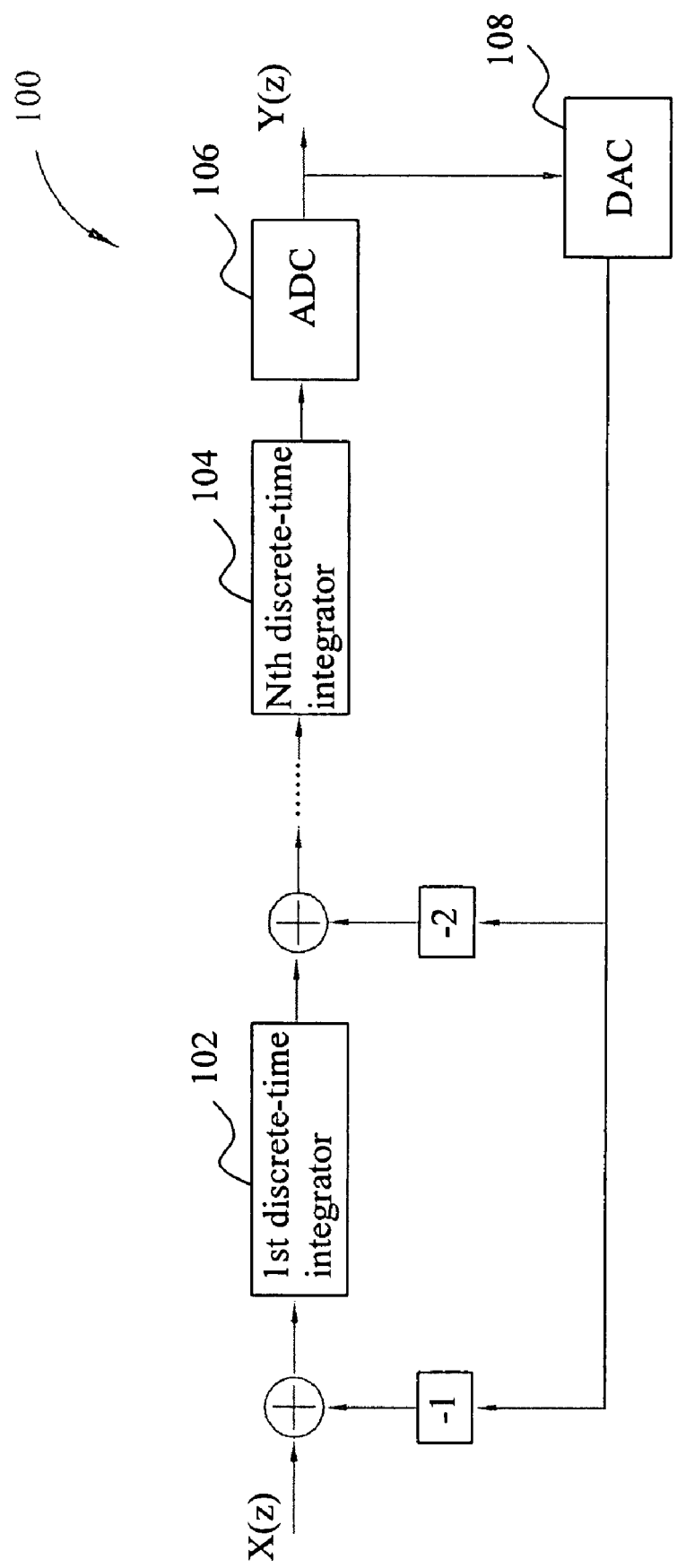
FIG. 1 is a block diagram of a sigma-delta modulator according to the prior art.
Figure 3:
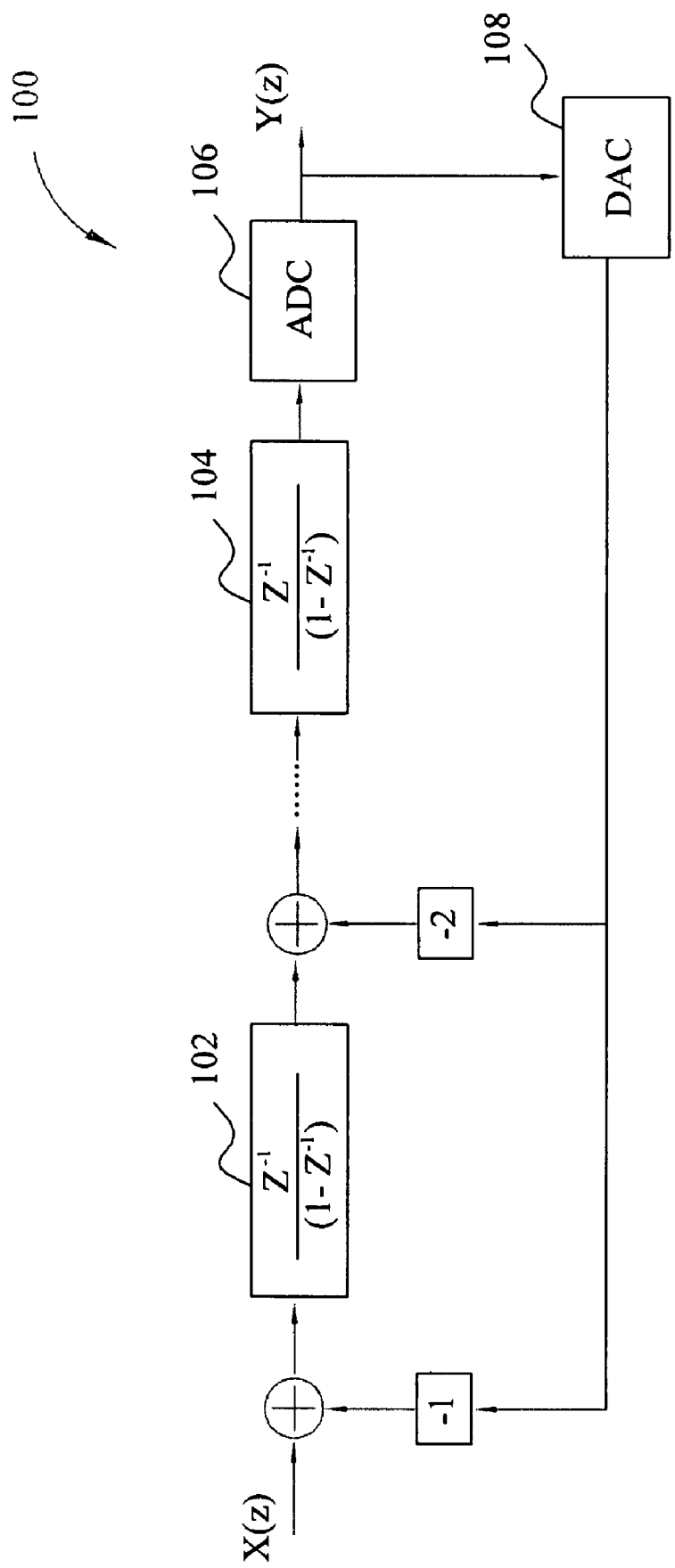
FIG. 3 is a block diagram of the sigma-delta modulator shown in FIG. 1 in a Z domain.

Please refer to FIG. 3. FIG. 3 is a block diagram of the sigma-delta modulator shown in FIG. 1 in the Z domain. A discrete-time integrator (e.g.,: the integrators 102 and 104) is represented as $Z^{-1}/(1-Z^{-1})$ in the Z domain. If the first and the second integrators 102 and 104 are both implemented by discrete-time integrators, such as the conventional sigma-delta modulator 100, the NTF of the sigma-delta modulator 100 is:

$$NTF = (1-Z^{-1})^2 \quad \text{equation (1)}$$
$$= (Z-1)^2/Z^2$$

Figure 4:
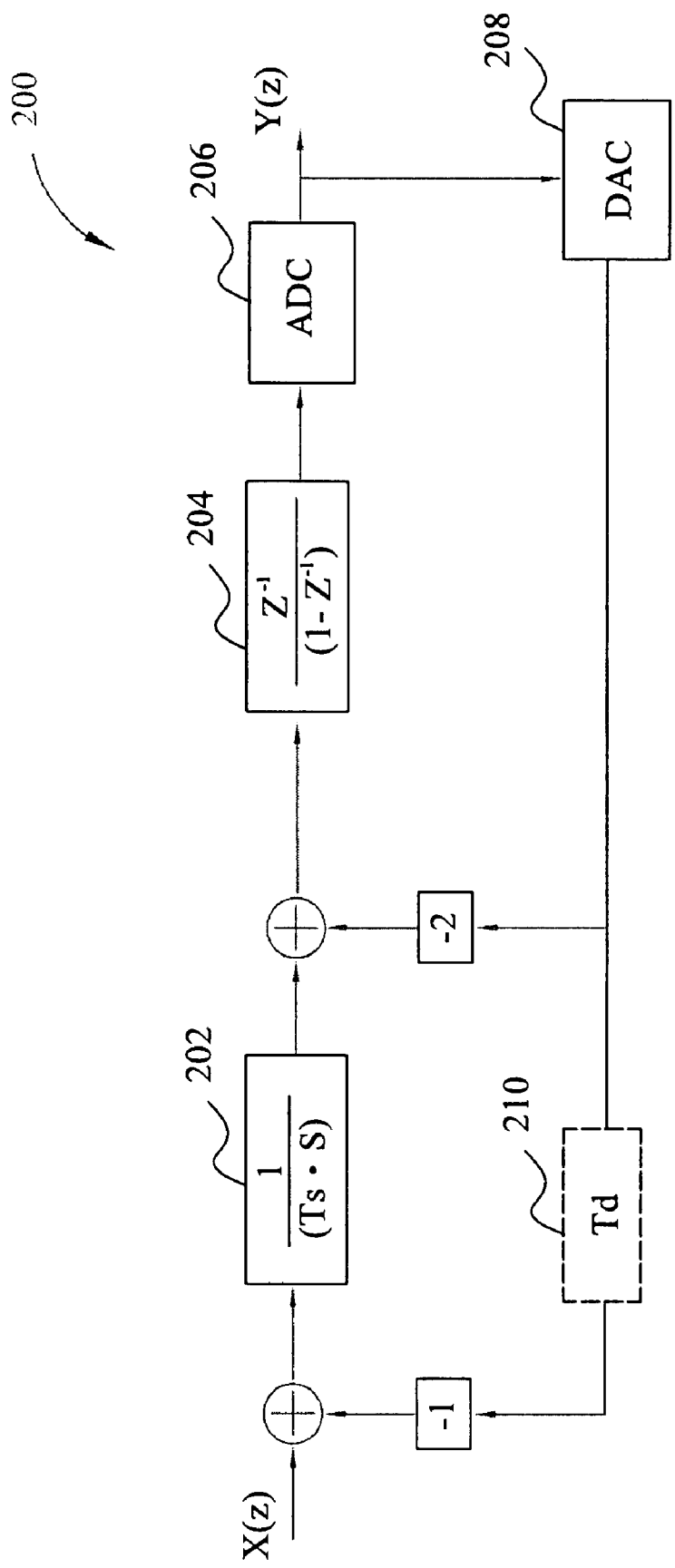
FIG. 4 is a block diagram of the sigma-delta modulator shown in FIG. 2 without compensation devices in the Z domain according to the present invention.

Alternatively, as shown in FIG. 4, assume that the time delay 210 of the present invention sigma-delta modulator 210 is represented as Td.

Please refer to FIG. 4. FIG. 4 is a block diagram of the sigma-delta modulator shown in FIG. 2 without compensation devices in the Z domain according to the present invention. An integrator 202 is a continuous-time integrator and is represented as $1/(Ts \cdot S)$ in the frequency domain.

Figure 5:
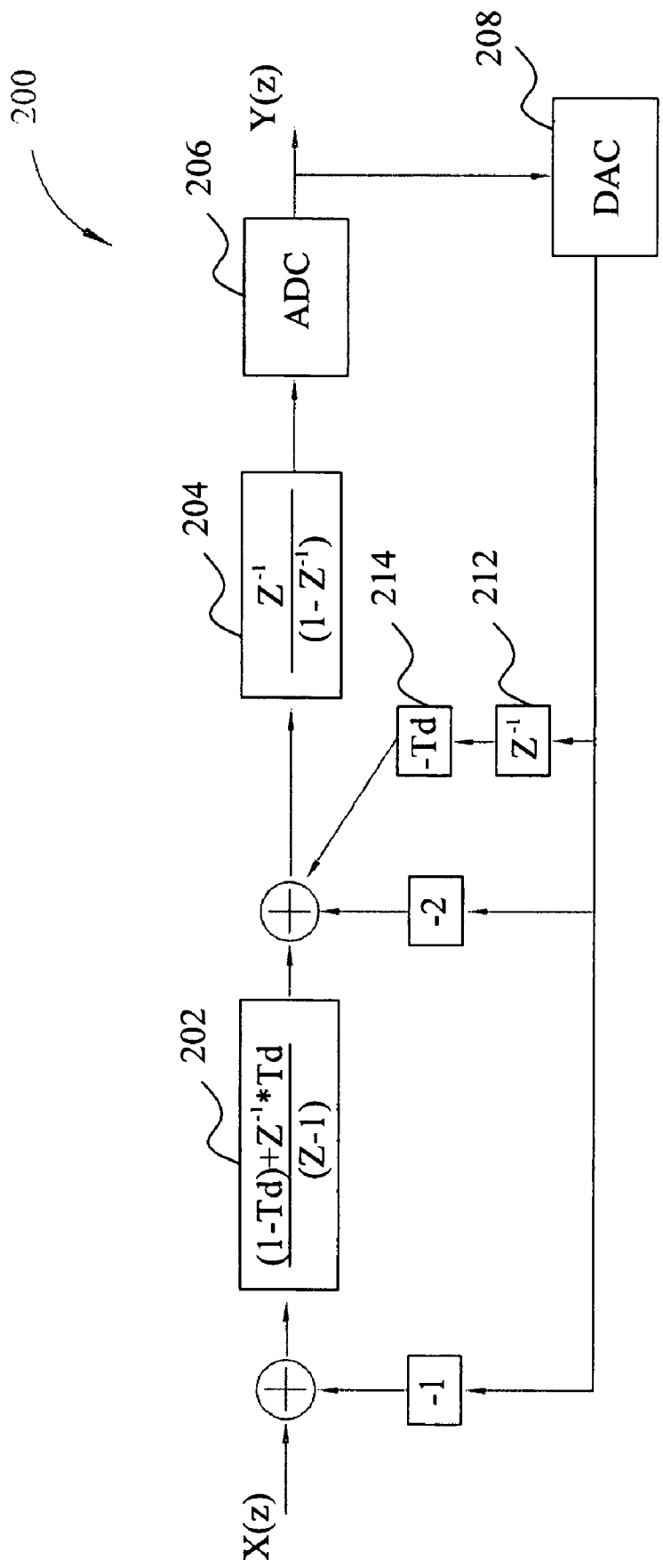
FIG. 5 is a block diagram of the sigma-delta modulator shown in FIG. 2 in the Z domain according to the present invention.

Please refer to FIG. 5. As shown in FIG. 5, the first integrator 202 is implemented with a continuous-time integrator. The integrator 202 can be equivalently represented by $((1-Td)+Z^{-1} \cdot Td)/(Z-1)$ with the time delay being Td.

Furthermore, the noise transfer function ($NTF_{original}$) of the sigma-delta modulator 200 is:

$$NTF_{original} = (1-Z^{-1})^2 / (1-Td \cdot Z^{-2}+Td \cdot Z^{-3}) \quad \text{equation (2)}$$
$$= (Z \cdot (Z-1)^2)/(Z^3-Td \cdot Z+Td)$$

Considering the equations (1) and (2), it can be seen that the time delay Td transforms a $2_{nd}$-order noise transfer function (NTF) into a $3_{rd}$-order function. As known by those having average skill in the art, this reduces the stability of the entire system.

According to an embodiment of the present invention, compensation devices are added to the sigma-delta modulator 200. For example, assume that the compensation device is represented by:

$$K \cdot Z^{-1} \quad \text{equation (3)}$$

wherein the K is the value to eliminate/remove (i.e., compensate for) the time delay thereby satisfying the object of the present invention.

Here, as shown in FIG. 5, the $2_{nd}$-order feedback is:

$$2+K \cdot Z^{-1} \quad \text{equation (4)}$$

Equation (3) is substituted into equation (2) and the resulting noise transfer function is:

$$NTF_{original}=(1-Z^{-1})^2/(1-(Td-K) \cdot Z^{-2}+(Td-K) \cdot Z^{-3}) \quad \text{equation (5)}$$

Setting equation (5) equal to equation (2) results in K=Td.

Next, the preceding result is substituted into equation (4). Therefore, it can be seen that if the second-stage feedback is $2+Td \cdot Z^{-1}$, the continuous-time noise transfer function $NTF_{original}$ can be equal to the discrete-time noise transfer function NTF.

From the above disclosure, the $2_{nd}$-stage compensation must be $Td \cdot Z^{-1}$. Therefore, as shown in FIG. 5, the first compensation device 212 (represented as Td) and the second compensation device 214 (represented as $Z^{-1}$) are serially coupled to each other and established between the DAC 208 and the input end of the second integrator 204. In this way, the time delay 210 can be eliminated. Therefore, the first integrator 202 implemented by a continuous-time integrator can equivalently operate as a discrete-time integrator.

Please note that, in the above-mentioned embodiment, only the first integrator 202 is a continuous-time integrator However, this structure is offered as an embodiment and is not a limitation of the present invention. All other sigma-delta modulators, which utilize a compensation device to compensate for time delays and include a continuous-time integrator, also belong to the scope of the present invention.

While certain exemplary embodiments have been described and shown in the accompanying drawings, it is to be understood that such embodiments are merely illustrative of and not restrictive on the broad invention, and that this invention should not be limited to the specific construction and arrangement shown and described herein, since various other modifications may occur to those ordinarily skilled in the art.

What is claimed is:

1. A sigma-delta modulator comprising:
    a first integrator, for receiving an input signal and generating a first output signal;
    a second integrator, for receiving the first output signal and generating a second output signal;
    an analog-to-digital converter (ADC), for converting the second output signal into a digital modulation signal;
    a digital-to-analog converter (DAC), for converting the digital modulation signal into an analog feedback signal and transmitting the analog feedback signal to the first integrator and the second integrator; and
    a compensation device, for generating a compensation signal;
    wherein the compensation signal is utilized for compensation the analog feedback signal for a time delay caused by a feedback loop from the ADC through the DAC to the first integrator;
    wherein if the time delay is regarded as Td in the z-domain, the compensation signal comprises $Td*Z^{-1}$;
    wherein the compensation device comprises a first compensation unit and a second compensation unit, and the first compensation unit is coupled to the second compensation unit;
    wherein the first compensation unit is represented by Td in the z-domain.

2. The sigma-delta modulator of claim 1, wherein the first integrator is a continuous-time integrator.

3. The sigma-delta modulator of claim 1, wherein the second integrator is a discrete-time integrator.

4. The sigma-delta modulator of claim 1, wherein the second compensation device is represented by $Z^{-1}$ in the z-domain.

* * * * *